(12) United States Patent
Ng et al.

(10) Patent No.: US 9,093,559 B2
(45) Date of Patent: Jul. 28, 2015

(54) METHOD OF HYBRID HIGH-K/METAL-GATE STACK FABRICATION

(75) Inventors: Jin-Aun Ng, Hsinchu (TW); Po-Nien Chen, Miaoli (TW); Sheng-Chen Chung, Jhubei (TW); Bao-Ru Young, Zhubei (TW); Hak-Lay Chuang, Singapore (SG)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 261 days.

(21) Appl. No.: 13/415,967

(22) Filed: Mar. 9, 2012

(65) Prior Publication Data

US 2013/0234254 A1 Sep. 12, 2013

(51) Int. Cl.
| | |
|---|---|
| *H01L 21/8238* | (2006.01) |
| *H01L 21/28* | (2006.01) |
| *H01L 29/49* | (2006.01) |
| *H01L 29/51* | (2006.01) |
| *H01L 29/66* | (2006.01) |
| *H01L 29/78* | (2006.01) |

(52) U.S. Cl.
CPC ...... *H01L 21/823842* (2013.01); *H01L 21/823857* (2013.01); *H01L 29/6656* (2013.01); *H01L 29/6659* (2013.01); *H01L 29/66545* (2013.01); *H01L 21/28079* (2013.01); *H01L 21/28088* (2013.01); *H01L 29/495* (2013.01); *H01L 29/4966* (2013.01); *H01L 29/517* (2013.01); *H01L 29/665* (2013.01); *H01L 29/66636* (2013.01); *H01L 29/7833* (2013.01); *H01L 29/7848* (2013.01)

(58) Field of Classification Search
None
See application file for complete search history.

(56) References Cited

U.S. PATENT DOCUMENTS

| | | | |
|---|---|---|---|
| 2010/0052070 A1* | 3/2010 | Chung et al. | 257/369 |
| 2011/0195557 A1* | 8/2011 | Teo et al. | 438/384 |
| 2011/0237040 A1* | 9/2011 | Ng et al. | 438/303 |

* cited by examiner

*Primary Examiner* — Robert Bachner
(74) *Attorney, Agent, or Firm* — Haynes and Boone, LLP

(57) ABSTRACT

A process fabricating a semiconductor device with a hybrid HK/metal gate stack fabrication is disclosed. The process includes providing a semiconductor substrate having a plurality of isolation features between a PFET region and a NFET region, and forming gate stacks on the semiconductor substrate. In the PFET region, the gate stack is formed as a HK/metal gate. In the NFET region, the gate stack is formed as a polysilicon gate. A high-resistor is also formed on the semiconductor substrate by utilizing another polysilicon gate.

20 Claims, 9 Drawing Sheets

METHOD OF HYBRID HIGH-K/METAL-GATE STACK FABRICATION

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. When a semiconductor device such as a metal-oxide-semiconductor field-effect transistor (MOSFET) is scaled down through various technology nodes, several strategies have been employed to improve device performance, such as using high-k (HK) dielectric material and metal gate (MG) electrode structures, strain engineering, 3-D gate transistors and ultra-thin body (UTB). It is desired to develop a process integration to provide a flexibility and an easy adaption between advanced HK/MG and conventional polysilicon gate processes.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
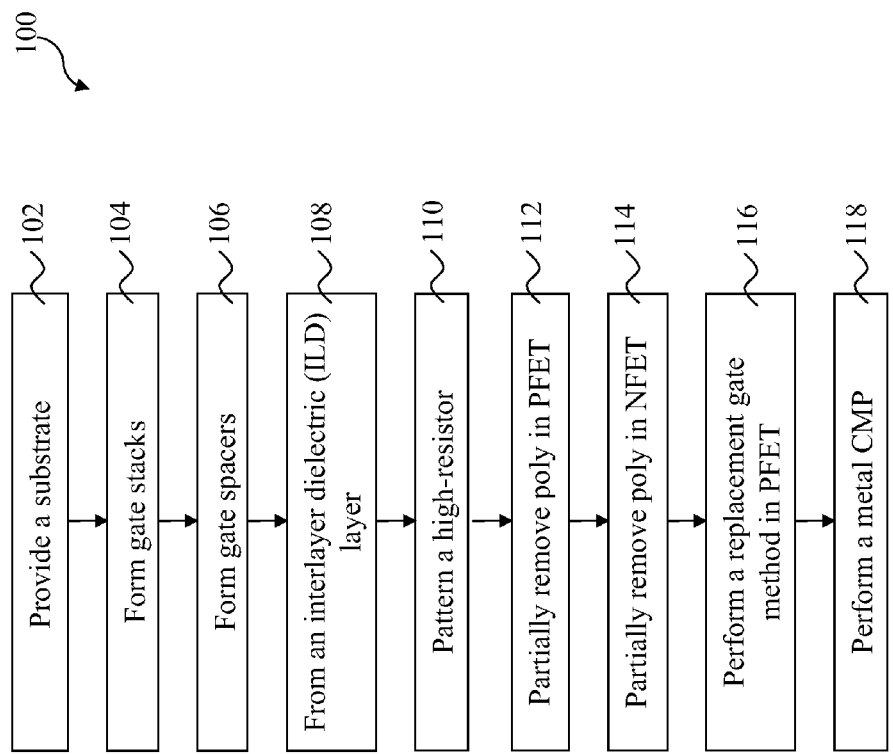
FIG. 1 is a flowchart of an example method for making a semiconductor device having a hybrid high-k/metal gate stack constructed according to various aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 2:
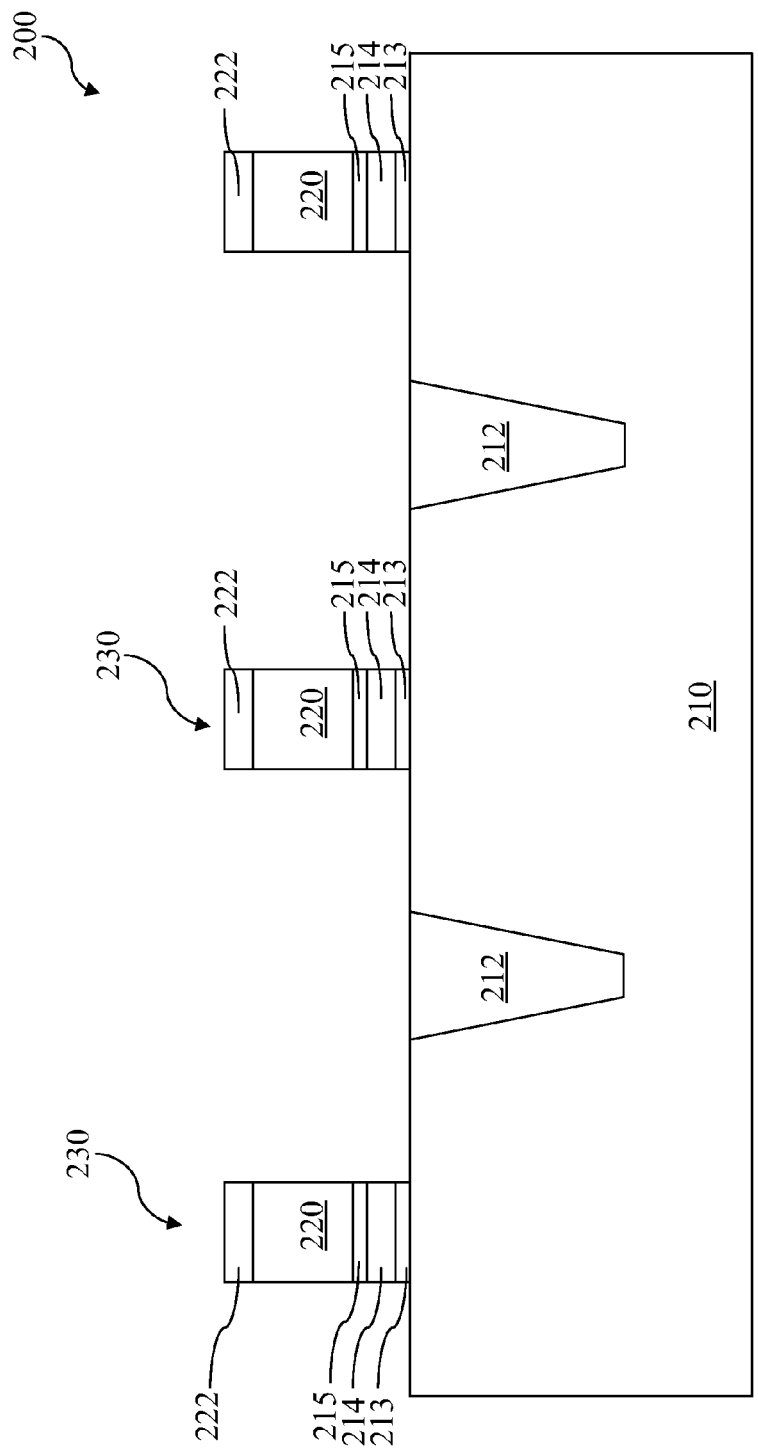
FIGS. 2-9 are cross-sectional views of an example semiconductor device having a hybrid HK last/metal gate stack structure at fabrication stages constructed according to the method of FIG. 1.

FIG. 1 is a flowchart of one embodiment of a method 100 making a semiconductor device having a hybrid high-k/metal gate stack constructed according to aspects of the present disclosure. FIGS. 2 and 9 are sectional views of one embodiment of a semiconductor device 200 having a gate stack at various fabrication stages. The semiconductor device 200 and the method 100 of making the same are collectively described with reference to FIGS. 1 through 9.

The method 100 begins at step 102 by providing a semiconductor substrate 210. The substrate 210 includes silicon. Alternatively, the substrate may include germanium, silicon germanium, gallium arsenide or other appropriate semiconductor materials. Also alternatively, the semiconductor substrate 210 may include an epitaxial layer. For example, the substrate 210 may have an epitaxial layer overlying a bulk semiconductor. Further, the substrate 210 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 210 may include a semiconductor-on-insulator (SOI) structure such as a buried dielectric layer. Also alternatively, the substrate may include a buried dielectric layer such as a buried oxide (BOX) layer, such as that formed by a method referred to as separation by implantation of oxygen (SIMOX) technology, wafer bonding, SEG, or other appropriate method. In fact various embodiments may include any of a variety of substrate structures and material.

The semiconductor substrate 210 also includes various doped regions such as n-well and p-wells formed by a proper technique, such as ion implantation. The semiconductor substrate 210 also includes various isolation features, such as shallow trench isolation (STI) 212, formed in the substrate to separate various devices. The formation of the STI 212 may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI 212 structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to remove the excessive dielectric metals layers.

The method 100 proceeds to step 104 by forming a plurality of gate-stacks on the semiconductor substrate 210. In one embodiment, an interfacial layer 213 is formed on the silicon substrate 210. The interfacial layer 213 may include silicon oxide formed by a proper technique, such as an atomic layer deposition (ALD), thermal oxidation or UV-Ozone Oxidation.

A first high-k (HK) dielectric layer 214 is deposited over the interfacial layer 213. In present embodiment, the first HK dielectric layer 214 includes HfO2. Alternatively, the first HK dielectric layer 214 may include HfSiO, HfSiON, HfTaO, HfTiO, HfZrO, zirconium oxide, aluminum oxide, hafnium dioxide-alumina (HfO2—Al2O3) alloy, other suitable HK dielectric materials, or combinations thereof. The first HK dielectric layer 214 is formed by a suitable process such as ALD. Other methods to form the high k dielectric material layer include metal organic chemical vapor deposition (MOCVD), physical vapor deposition (PVD), UV-Ozone Oxidation or molecular beam epitaxy (MBE).

A capping layer 215 may be formed on the HK dielectric layer 214. The capping layer may include refractory metals and their nitrides (e.g. TiN, TaN, W$_2$N, TisiN, TaSiN) formed by a suitable process know in the art. A polysilicon layer 220 is formed on the capping layer 215. The polysilicon layer 220 is formed by a proper technique, such as CVD in a conventional manner.

A patterned hard mask 222 is formed on the polysilicon layer 220 to define various gate stack regions and various openings exposing the gate-stack material layers to be removed. The patterned hard mask 222 includes silicon nitride and/or silicon oxide, or alternatively photoresist. The patterned hard mask 222 may include a bi-layer. In the present embodiment, the hard mask 222 includes a bi-layer of silicon oxide and silicon nitride deposited by CVD process. The silicon nitride and silicon oxide layers are further patterned using a photolithography process to form a patterned photoresist layer and an etching process to etch the silicon oxide and silicon nitride within the openings of the patterned photoresist layer.

Referring also to FIG. 2, by using the patterned hard mask 222 as an etch mask, an etching process is applied to form gate-stacks 230 by etching the polysilicon layer 220, the capping layer 215, the first HK dielectric layer 214 and the interfacial layer 213. The etching process includes a dry etch, a wet etch, or a combination of dry etch and wet etch. The dry etching process may implement a, fluorine-containing gas (e.g., CF4, SF6, CH2F2, CHF3, and/or C2F6), chlorine-containing gas (e.g., C12, CHC13, CC14, and/or BC13), bromine-containing gas (e.g., HBr and/or CHBR3), iodine-containing gas, other suitable gases and/or plasmas, and/or combinations thereof. The etching process may include a multiple-step etching to gain etch selectivity, flexibility and desired etch profile. In the present embodiment, a multiple-step dry etching is employed in a conventional manner.

Figure 3:
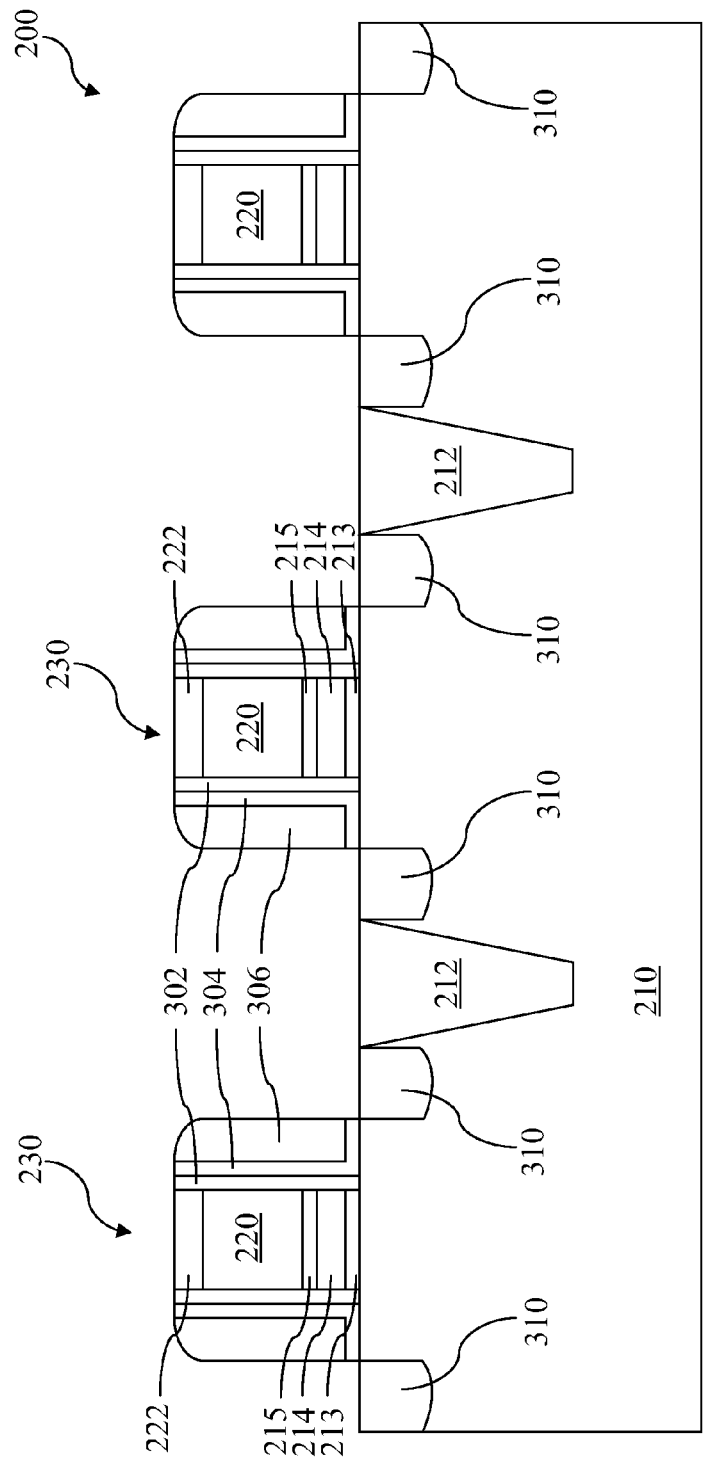

The method 100 proceeds to step 106 by forming a first gate spacer 302 (referred as to a seal spacer) and a second gate spacer 306 (referred to as a main spacer) on sidewalls of the gate stack 230, as shown in FIG. 3. The gate spacers 302 and 306 include one or more dielectric materials, such as silicon oxide, silicon nitride, silicon oxynitride or combinations thereof. The seal spacer 302 is formed on sidewalls of the gate stacks 230 and the main spacer 306 is formed on the seal spacer 302. In one embodiment, the spacers include additional layers. For example, a dielectric layer 304 is formed on the seal spacer 302 first then the main spacer 306 is formed on the dielectric layer 304. Accordingly, the main spacer can be considered a bi-layer spacer, with spacers 304 and 306. In the present embodiment, the seal spacer 302 includes silicon nitride, the dielectric layer 304 includes silicon oxide and the main spacer 306 includes silicon nitride. The spacers 302, 304, and 306 are formed by deposition, photolithography and etch processes in a conventional manner.

Referring also to FIG. 3, source and drain regions 310 are formed by a proper technique, such as one or more ion implantations. In one embodiment, silicide features (not shown) may be further formed on the source and drain regions 310 to reduce the contact resistance. The silicide features may be formed by a technique referred to as self-aligned silicide (salicide) including metal deposition (such as nickel deposition) onto a silicon substrate, a thermal anneal to react the metal with silicon to form silicide (NiSi) and an etch to removed un-reacted metal. The source and drain regions 310 may further include lightly doped (LDD) regions substantially aligned with the seal spacer 302 and a heavily doped regions substantially aligned with the main spacers 306.

After the formation of the source and drain (S/D) regions 310, one or more annealing processes may be performed to activate the S/D regions. The annealing processes comprise rapid thermal annealing (RTA), laser annealing processes, or other suitable annealing processes. As an example, a high-temperature thermal annealing step that may apply temperatures anywhere in the range of 900C-1100C, though other embodiments may use temperatures within a different range. As another example, high-temperature annealing includes a "spike" annealing process that has a very short time duration.

In another embodiment, the source and drain region 310 may include epitaxially grown semiconductor material for proper strain effect, leading to enhanced carrier mobility in the channel. In one embodiment, silicon germanium is epitaxially grown in the source and region for a p-type FET (PFET). In another embodiment, silicon carbide is epitaxially. grown in the source and region for a n-type FET (NFET). The method to form the strained structure includes etching to form recesses in the substrate and epitaxially growth to form crystalline a semiconductor material in the recesses.

Figure 4:
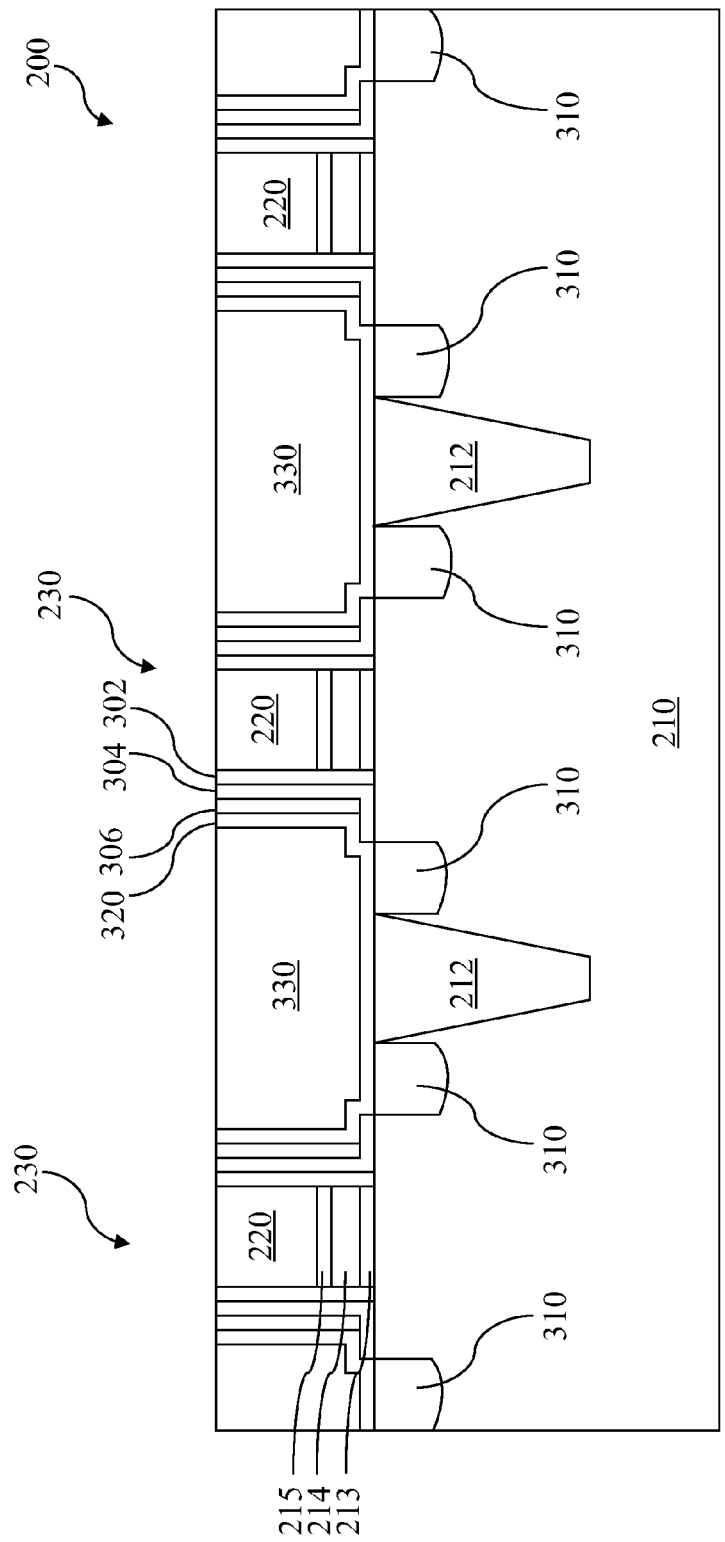

The method 100 proceeds to step 108 by forming an interlayer dielectric (ILD) layer 330 on the substrate and between the gate stacks 230. The ILD layer 330 is deposited by a proper technique, such as CVD. The ILD layer 330 includes a dielectric material, such as silicon oxide, silicon nitride, a low k dielectric material or a combination thereof. In one embodiment, additional processes are employed before the ILD layer 330 deposition. For example, additional processes include first partially removing (thinning) the main spacer 306 by wet etching, then removing the hard mask 222 by dry etching and depositing a contact etch stop layer (CESL) 320 on the substrate and the gate stacks 230 (with thinner main spacer) by a CVD process. A chemical mechanical polishing (CMP) process may be applied thereafter to planarize the surface of the ILD 330, as shown in FIG. 4.

Figure 5:
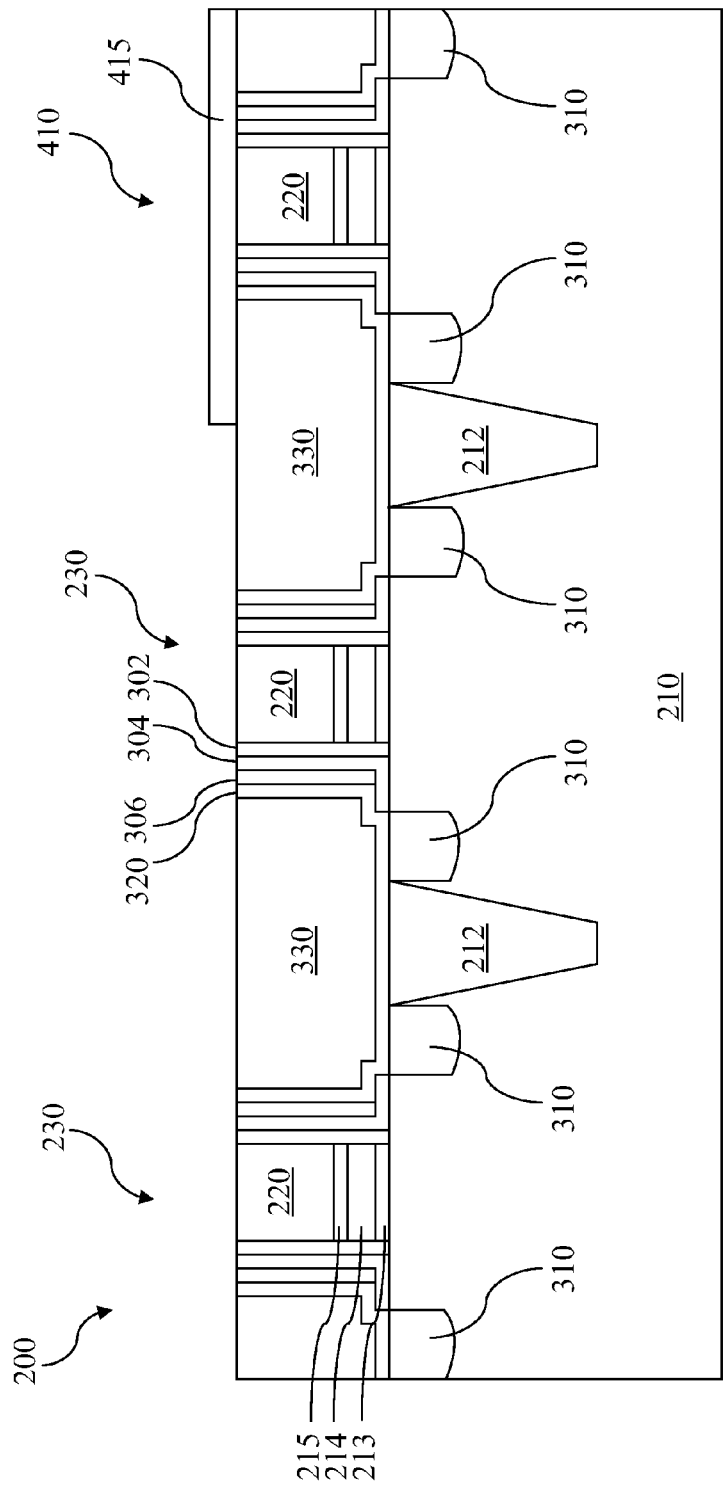

The method 100 proceeds to step 110 by patterning a high-resistor 410, as shown in FIG. 5. A plurality of gate stacks 230 may be utilized as the high-resistors 410 (referring to as a first gate stack 230). A patterned hard mask 415 is formed to protect the first gate stack 230 (high-resistor 410) in future etching processes. In the present embodiment, the hard mask 415 includes titanium nitride. The patterned hard mask 415 is formed by suitable processes of deposition, lithography and etch known in the art.

Figure 6:
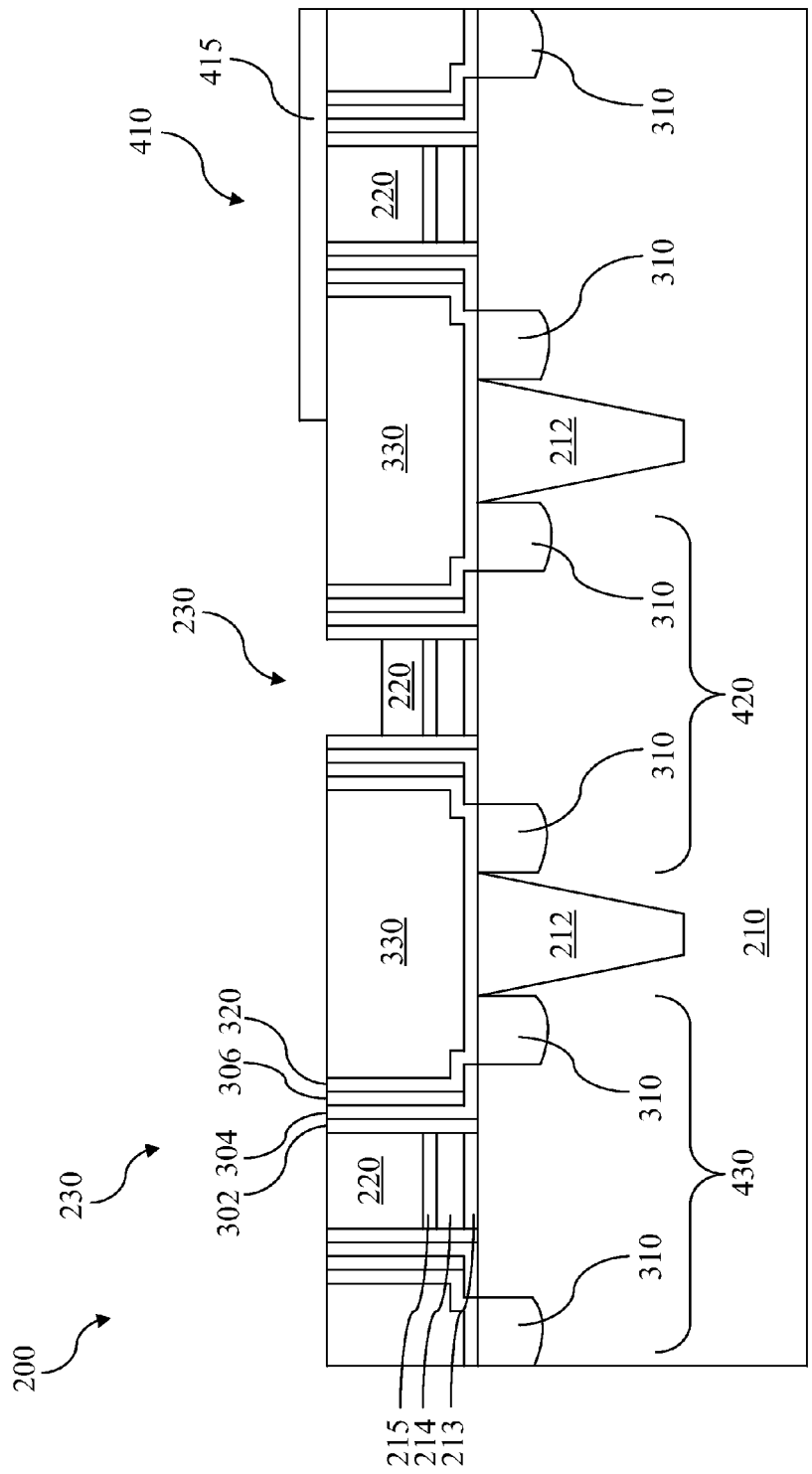

The method 100 proceeds to step 112 by partially removing polysilicon layer 220 in the gate stack 230 in a PFET region 420 (referring to as a second gate stack 230), as shown in FIG. 6. A photo resist is patterned to cover a predetermined NFET region 430 (referring to as a third gate stack 230) to defining a boundary of the PFET region and the NFET region. The photoresist covers the first gate stack 230 (high-resistor 410) as well. A first gate etching is performed to partially remove polysilicon layer 220 in the second gate stack 230 in the PFET region 420 while the third gate stack 230 in the NFET region 430 remains intact, as well as the first gate stack 230 (high-resistor 410). The first gate etching may include a dry etch, a wet etch, or a combination of dry and wet etch.

Figure 7:
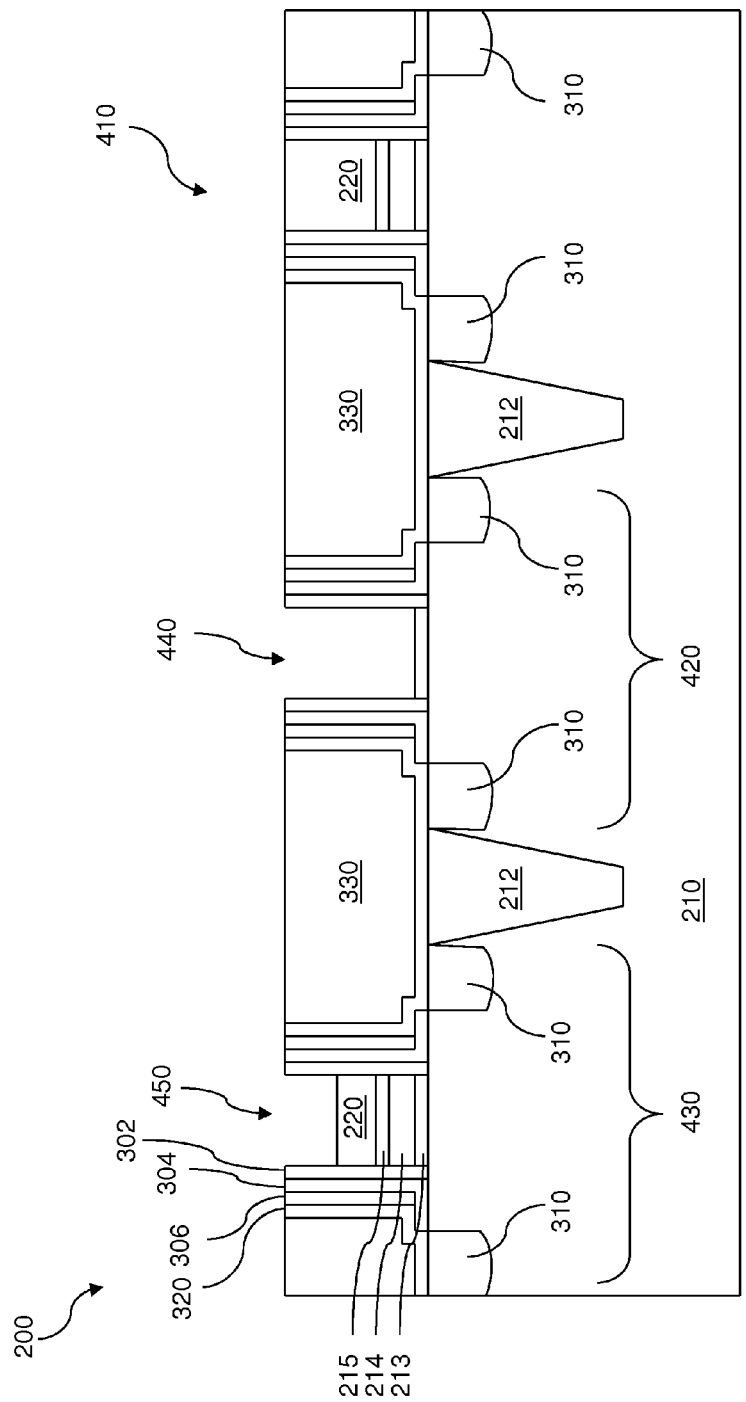

The method 100 proceeds to step 114 by partially removing polysilicon layer 220 in the third gate stack 230 in the NFET region 430 and removing rest of pollysilicon layer 220 in the second gate stack 230 in the PFET region 420, as shown in FIG. 7. First the patterned photoresist (for the first gate etching) is removed and the NFET region 430 now is exposed. A second gate etching is applied and controlled to remove rest of polysilicon layer 220, the capping layer 215 and the first HK dielectric layer 214 in the second gate stack 230 in the PFET region 420 and form a PFET gate trench 440. Meantime the second gate etching achieves a partially removal of polysilicon layer 220 in the third gate stack 230 in the NFET region 430 and form a NFET gate trench 450. The second gate etching also removes the patterned hard mask 415 on the first gate stack 230 (high-resistor 410). A multiple-step etching may be employed for gaining etching selectivity and flexibility.

Figure 8:
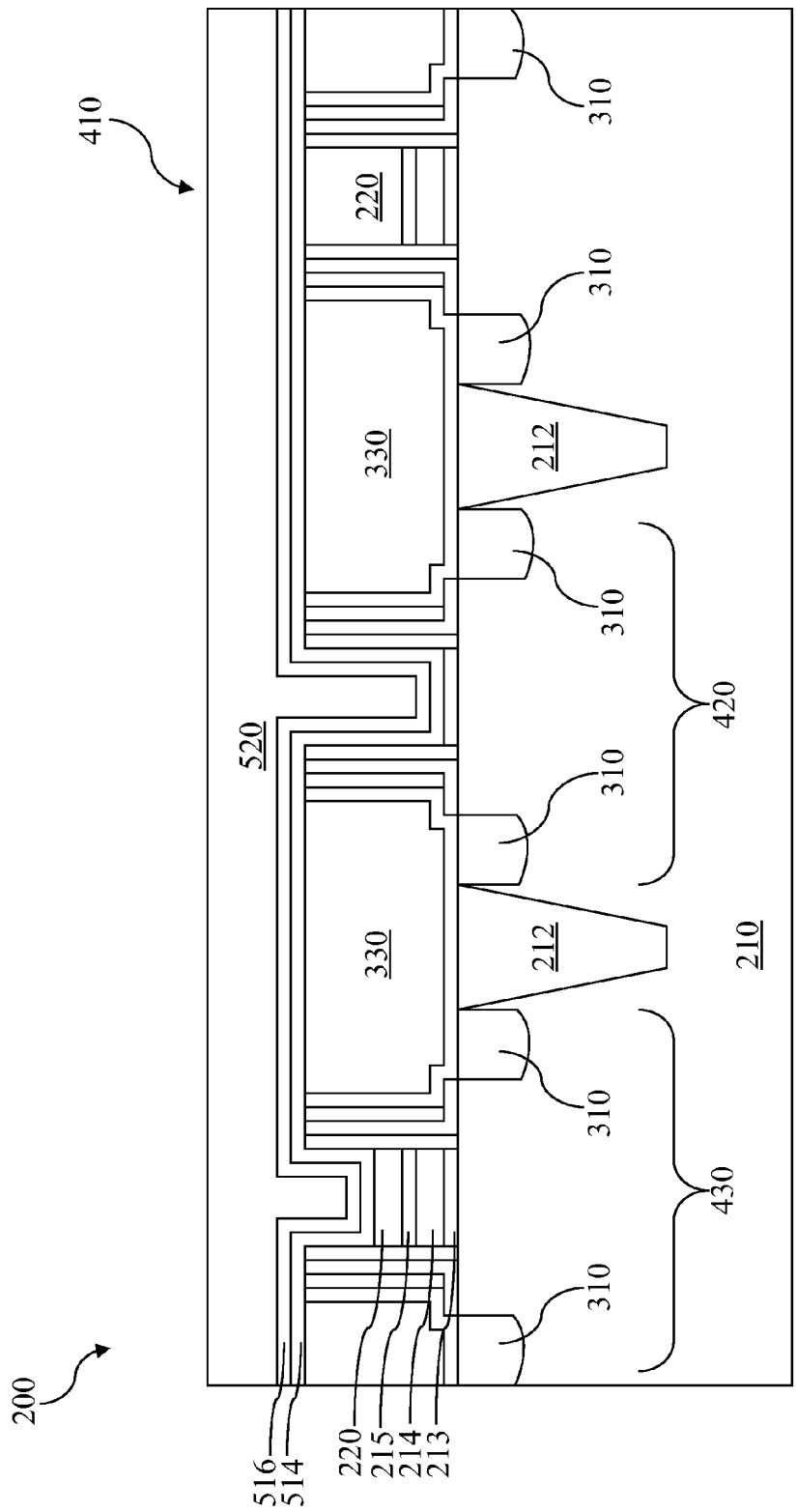
Figure 9:
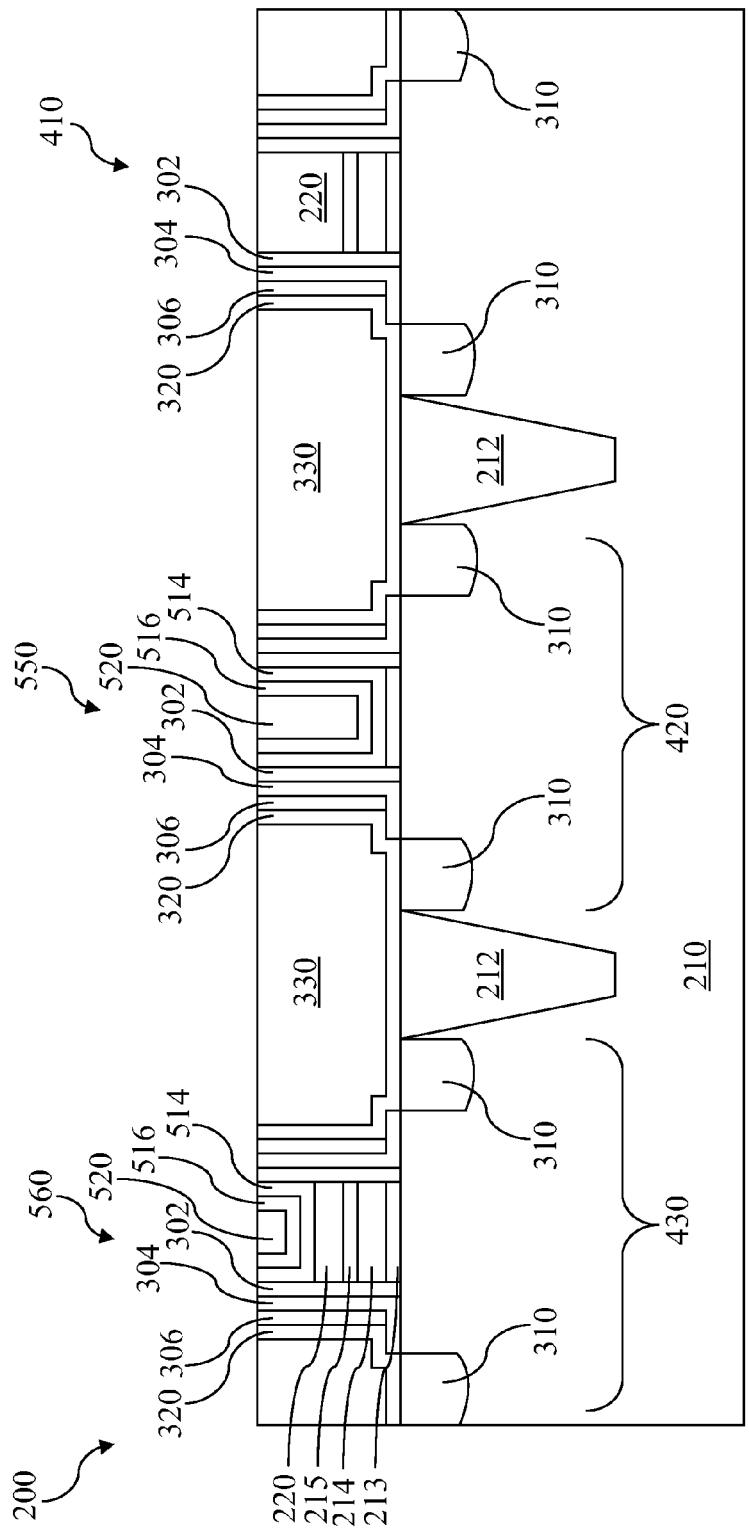

The method 100 proceeds to step 116 by performing a replacement gate method to form a HK/metal gate in the PFET region 420, as shown in FIG. 8. In a replacement gate method, a dummy gate structure is formed and used to self-align the source and drain implant and anneals. After high temperature processes (such as source and drain annealing) are completed, the dummy gate is replaced by a HK/metal gate. A second HK dielectric layer 514 is deposited in the PFET gate trench 440 as well as the NFET gate trench 450. A formation of the second HK dielectric layer 514 is similar in many respects to those discussed above in association with the first HK dielectric layer 214.

Referring also to FIG. 8, a p-type work function (p-WF) metal layer 516 is deposited on the second HK dielectric layer 514. The p-WF metal layer 516 includes a single metal layer or multi-metal layer structure, such as having a fill metal layer, liner layer, wetting layer, and adhesion layer. The p-WF metal layer 516 includes TiN, TaN, Ru, Mo, WN, and combinations thereof. The p-WF metal layer 516 may be formed by ALD, PVD, CVD, or other suitable process. A filling metal layer 520 is deposited on the p-WF metal layer 516. The filling metal layer 520 may include aluminum, tungsten, copper or other suitable metal. The filling metal layer 520 is deposited by a suitable technique, such as PVD or plating.

The method 100 proceeds to step 118 by performing a metal CMP to remove the excessive metals layers of 520 and 516 and the second HK dielectric layer 514. In the semiconductor substrate 210, a HK/metal gate 550 is formed ((by a gate-last method) in the PFET region 420, a polysilicon gate 560 is formed (by a gate-first method) with a multiple metal layers (p-WF metal layer 516) as a top portion of the gate stack in the NFET region 430 and a polysilicon high-resistor 410 is formed as well. The CMP process to provide a substantially planar surface for the gate stacks 550, 560, the high-resistor 410 and ILD 330, as shown in FIG. 9.

The method 100 may further include forming a multilayer interconnection. The multilayer interconnection (not shown) may include vertical interconnects, such as conventional vias or contacts, and horizontal interconnects, such as metal lines. The various interconnection features may implement various conductive materials including copper, tungsten and silicide. In one example, a damascene process is used to form copper related multilayer interconnection structure. In another embodiment, tungsten is used to form tungsten plug in the contact holes.

Although embodiments of the present disclosure have been described in detail, those skilled in the art should understand that they may make various changes, substitutions and alterations herein without departing from the spirit and scope of the present disclosure. In one embodiment, the gate electrode may alternatively or additionally include other suitable metals.

Based on the above, it can be seen that the present disclosure offers a hybrid gate integration scheme of forming a gate-first poly gate in a NFET and a gate-last HK/metal gate in a PFET simultaneously, and forming a compatible high-resistor as well. Furthermore, the gate-first polysilicon gate in NFET is configured with a p-WF metal and a filling metal on top of polysilicon gate, which reduces gate resistance (similar as being seen in a polycide gate). The hybrid gate integration scheme provides a technological solution for a directly convergent of a HK/metal gate with a conventional polysilicon gate and a significant flexibility for process integration.

The present disclosure offers a method to achieve a removal of polysilicon layer (e.g. in PFET) and partial removal of polysilicon layer (e.g. in NFET) at a same etch step. A gate-last HK/metal gate (in the PFET) and a gate-first poly gate with reduced gate resistance (in the NFET) are made simultaneously. The method provides a quite simple way to build a high-resistor by protecting a polysilicon gate stack from gate etchings. The method also employs a single metal CMP to gain process window improvement, defect reduction and process controllability improvement. The method is easily adapt to an existing manufacturing process flow.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A process for fabricating a semiconductor device, the process comprising:
    providing a semiconductor substrate with a plurality of isolation features and a first high-k (HK) dielectric material;
    forming first, second, and third polysilicon gate stacks on the semiconductor substrate;
    forming sidewall spacers on the polysilicon gate stacks;
    forming a source and a drain on the semiconductor substrate;
    forming an interlayer dielectric (ILD) layer on the semiconductor substrate;
    performing a chemical mechanical planarization (CMP) on the ILD layer;
    forming a patterned hard mask on the first polysilicon gate stacks to define a high-resistor on the semiconductor substrate;
    patterning and defining an n-type field-effect transistor (NFET) region with the second polysilicon gate stack and a p-type field-effect transistor (PFET) region with the third polysilicon gate stack on the semiconductor substrate;
    performing a first gate etch to partially remove the third polysilicon gate stack in the PFET region;
    after the first gate etch, exposing both the NFET region, the PFET region and the high-resistor;
    performing a second gate etch to partially remove the second polysilicon gate stack in the NFET region to form a NFET gate trench; and
    removing polysilicon in the PFET region to form a PFET gate trench; and
    removing the patterned hard mask on the first polysilicon gate stack;
    filling both the PFET and the NFET gate trenches with a second HK dielectric material;
    depositing a p-type work function (p-WF) metal on the second HK dielectric material on both of the PFET and the NFET gate trenches;
    depositing a filling metal layer on the p-WF metal layer;
    performing a metal CMP to remove excessive metal layer and excess second HK dielectric material to form HK/metal gate stacks in the NFET and PFET regions.

2. The method of claim 1, wherein the hard mask of the high-resistor provides a high etch resistance during the first gate etching.

3. The method of claim 1, wherein before depositing the ILD layer, a thickness of the sidewall spacers is thinned by a wet etch technique.

4. The method of claim 1, wherein a contact etch stop layer (CESL) is disposed between the ILD layer and the semiconductor substrate.

5. The method of claim 1, wherein in the first gate etch, polysilicon in the NFET remains intact while polysilicon in the PFET is partially removed.

6. The method of claim 1, wherein in the second gate etch, polysilicon in the PFET is removed while the polysilicon in the NFET is partially removed.

7. The method of claim 1, wherein the second HK dielectric layer is deposited on gate trenches of both the PFET and the NFET at the same time.

8. The method of claim 1, wherein the p-WF metal is deposited on gate trenches of both the PFET and the NFET at the same time.

9. The method of claim 1, wherein the second polysilicon gate stack in the NFET region is formed by a gate-first method.

10. The method of claim 1, wherein the HK/metal gate stack in the PFET region is formed by a gate-last method.

11. The method of claim 1, wherein the hard mask of the high-resistor is removed by the second gate etching.

12. A process of fabricating a semiconductor device, the process comprising:
providing a semiconductor substrate with a plurality of shallow trench isolation (STI) features to separate an NFET region and a PFET region;
forming a plurality of polysilicon gate stacks on the semiconductor substrate;
forming sidewall spacers on each of the polysilicon gate stacks;
forming source and drain regions on the semiconductor substrate;
forming an interlayer dielectric (ILD) layer on the semiconductor substrate;
forming a patterned hard mask on one of polysilicon gate stacks to define a high-resistor on the semiconductor substrate;
exposing the PFET region but not the NFET region and performing a first gate etch to partially remove polysilicon from a polysilicon gate stack in the PFET region;
after the first gate etch, exposing both the NFET region and the PFET region and performing a second gate etch to partially remove polysilicon from a polysilicon gate stack in the NFET region to form an NFET gate trench and remove polysilicon from a polysilicon gate stack in the PFET region to form a PFET gate trench;
filling both the PFET and the NFET gate trenches with a high-k (HK) dielectric material;
depositing a filling metal layer on both of the PFET and the NFET gate trenches to form HK/metal gate stacks.

13. The method of claim 12, wherein removal of the polysilicon layer in the PFET and partially removal of the polysilicon layer in the NFET are achieved in same etch step.

14. The method of claim 12, wherein the HK/metal gate stack in the PFET is formed by a gate-last method.

15. The method of claim 12, wherein the HK/metal gate stack in the NFET is formed by a gate-first method.

16. A method for making a semiconductor device with a hybrid HK/metal gate the method comprising:
providing a semiconductor substrate
forming on the semiconductor substrate a plurality of source and drain features, and a plurality of isolation features to separate the semiconductor substrate into an NFET region and a PFET region;
forming a first interfacial layer over the semiconductor substrate in the PFET region;
forming a second interfacial layer over the semiconductor substrate in the NFET region;
forming a HK dielectric layer over the interfacial layers;
forming a capping layer over the HK dielectric layer in the NFET region;
forming a polysilicon layer over the capping layer in the NFET region and over the HK dielectric layer in the PFET region;
patterning the first interfacial layer, the HK dielectric layer, and the polysilicon layer in the PFET region to form a first gate stack and patterning the second interfacial layer, the HK dielectric layer, the capping layer, and the polysilicon layer in the NFET region to form a second gate stack;
removing a first portion of the polysilicon layer from the first gate stack;
after removing the first portion of the polysilicon layer from the first gate stack, removing a second portion of the polysilicon layer from the first gate stack and a first portion of the polysilicon layer from the second gate stack;
forming a p-WF metal layer over a second portion of the polysilicon layer of the second gate stack in the NFET region and over the first interfacial layer of the first gate stack in the PFET region; and
depositing a metal layer on the p-WF layer.

17. The method of claim 16, further comprising:
forming spacers on sidewalls of the first and second gate stacks, wherein the spacers include a seal spacer and a main spacer.

18. The method of claim 17, wherein the seal spacer includes silicon nitride.

19. The method of claim 16, further comprising:
forming a high-resistor over the semiconductor substrate, wherein the capping layer is formed over the high-resistor and the polysilicon layer is formed over the capping layer.

20. The method of claim 16, further comprising forming another HK dielectric layer over the second portion of the polysilicon layer of the second gate stack in the NFET region and over the first interfacial layer of the first gate stack in the PFET region.

* * * * *